United States Patent
Aono et al.

(10) Patent No.: US 6,891,186 B2
(45) Date of Patent: May 10, 2005

(54) ELECTRONIC DEVICE HAVING CONTROLLABLE CONDUCTANCE

(75) Inventors: Masakazu Aono, Tokyo (JP); Kazuya Terabe, Toda (JP); Tsuyoshi Hasegawa, Tokyo (JP); Tomonobu Nakayama, Souka (JP)

(73) Assignee: Japan Science and Technology Corporation, Saitama (JP)

( * ) Notice: Subject to any disclaimer, the term of this patent is extended or adjusted under 35 U.S.C. 154(b) by 71 days.

(21) Appl. No.: 10/363,479

(22) PCT Filed: Aug. 30, 2001

(86) PCT No.: PCT/JP01/07514
§ 371 (c)(1),
(2), (4) Date: Feb. 27, 2003

(87) PCT Pub. No.: WO02/21598
PCT Pub. Date: Mar. 14, 2002

(65) Prior Publication Data
US 2004/0089882 A1 May 13, 2004

(30) Foreign Application Priority Data
Sep. 1, 2000 (JP) ........................... 2000-265344

(51) Int. Cl.⁷ ..................... H01L 29/06; H01L 21/44
(52) U.S. Cl. ............................. 257/14; 438/101
(58) Field of Search ............................. 257/14; 438/101

(56) References Cited
U.S. PATENT DOCUMENTS 4,996,570 A * 2/1991 Van Houten et al. ....... 257/194
5,751,156 A * 5/1998 Muller et al. ............... 324/699

* cited by examiner

Primary Examiner—Douglas Wille
(74) Attorney, Agent, or Firm—Gary C. Cohn PLLC (57) ABSTRACT

This invention provides a method for constructing bridge including fine wires or point contacts producing a quanitized inter-electrode conductance, and provides a method for easily controlling the conductance of this bridge. Further, it aims to provide an electronic element using conductance control due to the bridge, fine wire or point contact formed between the electrodes. These objects are accomplished with an electronic element comprising a first electrode comprising a mixed electroconducting material having ion conductance and electron conductance, and a second electrode comprising an electroconducting substance, wherein the inter-electric conductance can be controlled. In another aspect, this invention is an electronic element formed by a bridge between electrodes, by applying a voltage between the electrodes so that the second electrode is negative with respect to the first electrode and movable ions migrate from the first electrode to the second electrode. In a third aspect, this invention is a method of controlling inter-electrode conductance comprising at least one of applying a voltage between the electrodes of the above electronic element so that the second electrode is negative with respect to the first electrode so that a bridge is formed between the electrodes due to the migration of movable ions from the first electrode to the second electrode, and reversing the inter-electrode polarity so that the bridge is thinned or disconnected.

20 Claims, 5 Drawing Sheets

Fig. 10

ELECTRONIC DEVICE HAVING CONTROLLABLE CONDUCTANCE

FIELD OF THE INVENTION

This invention relates to an electronic element in which a bridge, thin wire and/or point contact can be formed, thinned or disconnected between facing electrodes, and to a method of controlling conductance using this electronic element.

PRIOR ART

Figure 1:
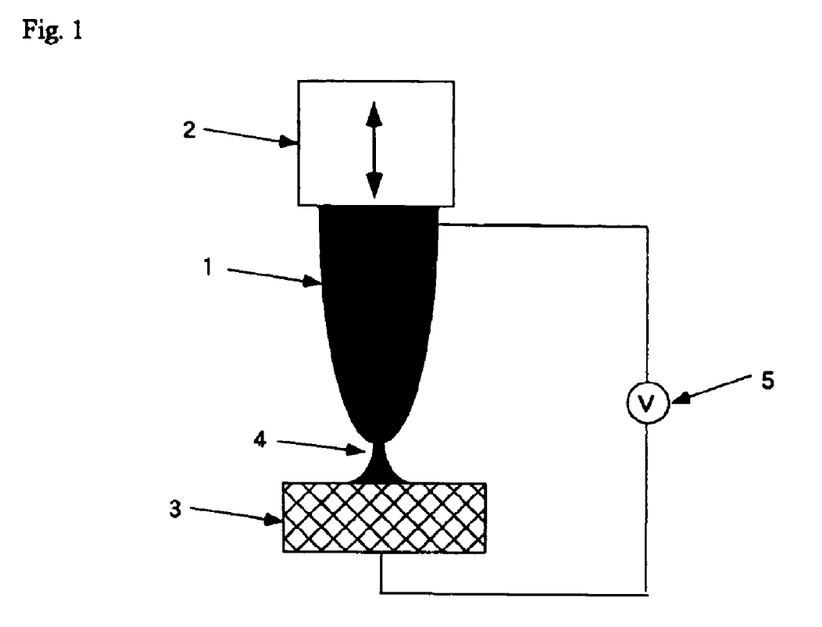
FIG. 1 is a diagram showing the construction of a bridge, thin wire and point contact by a metal needle using a piezo-electric element known in the art.

There are various reports in the literature regarding control of conductance by constructing bridges, thin wires and point contacts (J. K. Gimzewski and R. Moller: Phys. Rev. B36 (1987) 1284, J. L. Costa-Kramer, N. Garcia, P. Garcia-Mochales, P. A. Serena, M. I. Marques and A. Corrcia: Phys. Rev. B55 (1997) 5416, H. Ohnishi, Y. Kondo and K. Takayanagi: Nature 395 (1998) 780). As shown in FIG. 1, a bridge, a thin wire or a point contact is formed between a metal needle (gold, silver, copper, tungsten, etc.) to which a piezo-electric element is attached, and a facing substrate (gold, silver, copper, etc.). First, a voltage is applied to the piezo-electric element so that the piezo-electric element is extended and the metal needle is brought in contact with a facing substrate. Next, by gradually decreasing the voltage applied to the piezo-electric element, the piezo-electric element recedes, and the contact between the metal needle and facing substrate is gradually broken. In this separation process, a bridge (including a thin wire or a point contact) comprising metal atoms (gold, silver, etc.) is formed between the metal needle and facing substrate.

However, in order to construct an electronic element using this technique, a piezo-electric element which can move an electrode (i.e., metal needle) is required, but it is difficult to incorporate such an electric element into a circuit to make the electrode move. Further, as another electrode is required to drive the piezo-electric element, the method is unsuitable for inclusion in a high density integrated circuit. Moreover, to construct a bridge containing a thin wire or point contact producing a quantized conductance, the movement of the piezo-electric element must be intricately and precisely controlled. Thus, it is difficult to manufacture an electronic element with such a function in practice.

Problems which this Invention Attempts to Solve

It is therefore an object of this invention to provide a technique of constructing a bridge comprising a thin wire or point contact producing a quantized inter-electrode conductance, and to provide a technique of easily controlling the conductance of a bridge. It is another object of this invention to provide an electronic element using conductance control by a bridge, thin wire or point contact formed between electrodes.

Means for Solving the Above Problems

To solve the above problems, according to this invention:
(1) One electrode of the electronic element uses a mixed electroconducting material which combines ion conductivity and electron conductivity.
(2) When this electronic element is used, a voltage and current are applied between the mixed electroconductor electrode and the electrode facing it. This causes movable ions to migrate within the mixed electroconducting material, and form a projection comprising these ions (atoms) ranging from an atomic size to nanometer size on the electrode. This is then grown further so that it comes in contact with the facing electrode, and forms a bridge comprising these ions (atoms) between the electrodes. After the bridge is formed, the polarity of the applied voltage is reversed, causing the ions (atoms) forming the bridge to return to the original mixed electroconductor electrode, thereby thinning or disconnecting the bridge. These two steps are repeated as required according to the purpose.
(3) In the above (2), the bridge comprising a thin wire or point contact which produces quantization of the conductance is constructed by controlling the voltage or current between the electrodes.
(4) The bridge, thin wire or point contact between the electrodes in the above (2) or (3), is made to function as an electronic element using conductance control.

The main aspect of this invention is therefore an electronic element comprising a first electrode comprising a mixed electroconducting material having ion conductance and electron conductance, and a second electrode comprising an electroconducting substance, in which the conductance between the electrodes can be controlled. This mixed electroconducting material is preferably $Ag_2S$, $Ag_2Se$, $Cu_2S$ or $Cu_2Se$.

Another aspect of this invention is the above electronic element, wherein a bridge is formed between said electrodes, by applying a voltage between said electrodes so that the second electrode is negative with respect to the first electrode so that movable ions migrate from the first electrode to the second electrode.

Another aspect of this invention is a method of controlling inter-electrode conductance comprising at least one of the steps of;

a. applying a voltage between the electrodes of the above electronic element so that the second electrode is negative with respect to the first electrode so that a bridge is formed between the electrodes due to the migration of movable ions from the first electrode to the second electrode, and b. reversing the inter-electrode polarity so that the bridge is thinned or disconnected.

Yet another aspect of this invention is the above-mentioned method of controlling conductance by applying a pulse-like voltage between the electrodes. The inter-electrode conductance may be quantized. The conductance (G) is preferably expressed by:

$$G = \frac{2e^2}{h} \sum_{i=1}^{N} Ti$$

(where, e is the elementary charge, h is Planck's constant and Ti is the transmission probability of the ith channel contributing to conduction).

DETAILED DESCRIPTION OF THE INVENTION

Substances are known in the art wherein ions can easily migrate even in solid crystals just as they do in a solution. Substances in which only ions conduct electricity are referred to as ion conductors, and substances in which both ions and electrons conduct electricity are referred to as mixed electroconductors.

Figure 2:
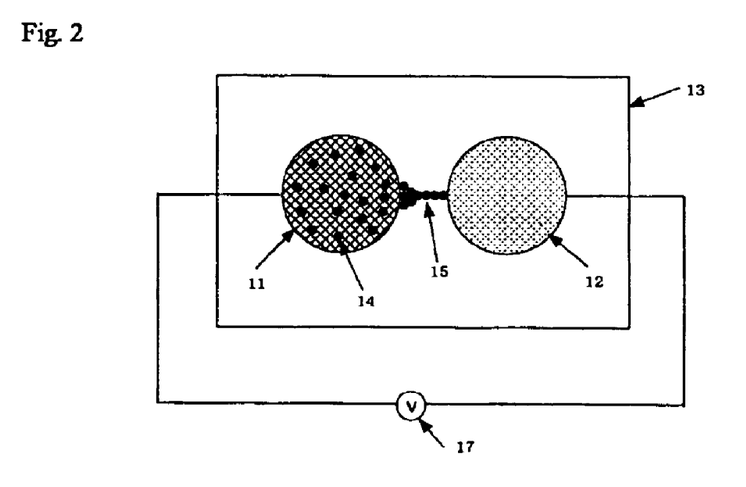
FIG. 2 is a diagram showing the method of constructing a bridge, thin wire and point contact according to this invention, and a specific example of an electronic element using this method.

A specific example of the electronic element according to this invention wherein a bridge is constructed between electrodes due to migration of movable ions (atoms) is shown in FIG. 2.

As shown in FIG. 2, a first electrode 11 comprising a mixed electroconducting material is used as one of facing electrodes. A different construction may also be envisaged wherein an electrode (11 and 12) is floated at a short distance from a substrate 13, and in this case, as there is no substrate between the electrodes in FIG. 2, the bridge is created in space.

The distance between the two electrodes is about 100 nanometers or less, preferably about 10 nanometers or less and more preferably about 5 nanometers or less.

The optimal distance between the electrodes however varies depending on the insulation and electrode materials. For example, the optimal distance changes depending on whether the electrodes are placed on a semiconductor or an insulator film or a substrate, or when a substrate is not used as described above, so it is necessary to suitably adjust the inter-electrode distance to obtain an optimal result.

The above inter-electrode distance is a guideline which takes this fact into consideration.

The voltage applied between the electrodes of this invention is 1V or less, preferably 0.5V or less, and more preferably 0.1V or less. The current flowing is 100 uA or less, preferably 50 uA or less, and more preferably 10 uA or less. The power consumption of this electronic element is $10^{-4}$ W or less, preferably $10^{-5}$ W or less, and more preferably $10^{-6}$ W or less.

The mixed electroconducting material of this invention may be a compound represented by $X_2Y$ (in the formula, X is a Group Ib metal (Cu, Ag, Au), Y is a Group IVa element (O, S, Se, Te, Po), a complex chalcogenide such as $Cu_xMo_6S_8$, $Ag_xMo_6S_8$, $Cu_xMo_3Se_4$, $Ag_xMo_3Se_4$, $Cu_xMo_3S_4$, $Ag_xMo_3S_4$, $AgCrSe_2$, an intermetal compound such as $Li_xAl$ (x is larger than 0 but less than 3), $Li_xSi_y$ (x is larger than 0 but less than 10, y is larger than 0 but less than 25), an oxide such as $M_xWO_3$ (M is an alkali metal, Ag or H, x is larger than 0 but less than 1), $M_xM'O_2$ (M is an alkali metal, Ag or H, x is larger than 0 but less than 1, M' is Ti, Co or Cr), or a chalcogen intercalation compound such as $MM'X_2$ (M is an alkali metal, Ag or Cu, M' is Ti, Ta, Zr, Nb, Ta or Mo, X is S or Se). However, compounds represented by $X_2Y$ (wherein X is a Group Ib metal (Cu, Ag, Au) and Y is a Group IVa element (O, S, Se, Te, Po) are preferred, and compounds where X is Cu or Ag and Y is S or Se ($Ag_2S$, $Ag_2Se$, $Cu_2S$, $Cu_2Se$) are particularly preferred. These may be used alone, or in mixtures thereof.

There is no particular limitation on the second electrode facing the first electrode provided that it is manufactured from an electroconducting substance, but as the electroconducting substance, a conductive metal is preferred.

When a suitable negative voltage is applied to the second electrode relative to the first electrode of the electronic element shown in FIG. 2, movable ions 14 in the mixed electroconductor deposit on the surface of the first electrode 11 depending on the effect of the voltage and current. A projection formed by the deposit of movable ions (atoms) is then gradually grown for a long period so that it comes in contact with the facing electrode 12 and forms a bridge 15.

Here, at least one of the atoms forming the mixed electroconductor of the first electrode is ionized, moves within the mixed electroconductor, and becomes a neutral atom which flows out of the mixed electroconductor depending on the conditions. In other words, if a suitable negative voltage is applied to the second electrode relative to the first electrode, the atoms which form the mixed electroconductor will become movable ions, and will migrate inside the electrodes in the direction of the second electrode. They then migrate to the outside from the electrode to form a bridge, but at this stage, the movable ions will be in a neutral atomic state. For example, in the case where the mixed electroconductor is $X_2Y$ (XY is the same as in the above), the movable ion is $X^+$. In the case of $Ag_2S$, it is $Ag^+$, so the bridge formed between the electrodes comprises X atoms or silver atoms. In this specification, in view of this fact, the movable ions and atoms may be abbreviated as movable ions (atoms).

By reversing the polarity of the applied voltage, the bridge 15 which was in contact becomes thin and disconnected due to the effect of the voltage and current.

By controlling the voltage and current between the electrodes at this time, a bridge including a thin wire or point contact which produces quantization of the conductance, may be constructed, and the inter-electrode conductance can be controlled by the bridge. Further, by controlling the conductance of this bridge, an electronic element may be manufactured.

Hereafter, this invention will be described by means of specific examples, but the invention is not to be construed as being limited thereby.

EXAMPLE 1

An electrode of a mixed electroconductor $Ag_2S$ crystal was first produced by vapor phase epitaxy. In this example, the material of the facing conductive electrode was platinum, and the substrate was an insulating material. The interval between these electrodes was about 1 nanometer, and a tunnel current was made to flow between the electrodes.

Figure 3:
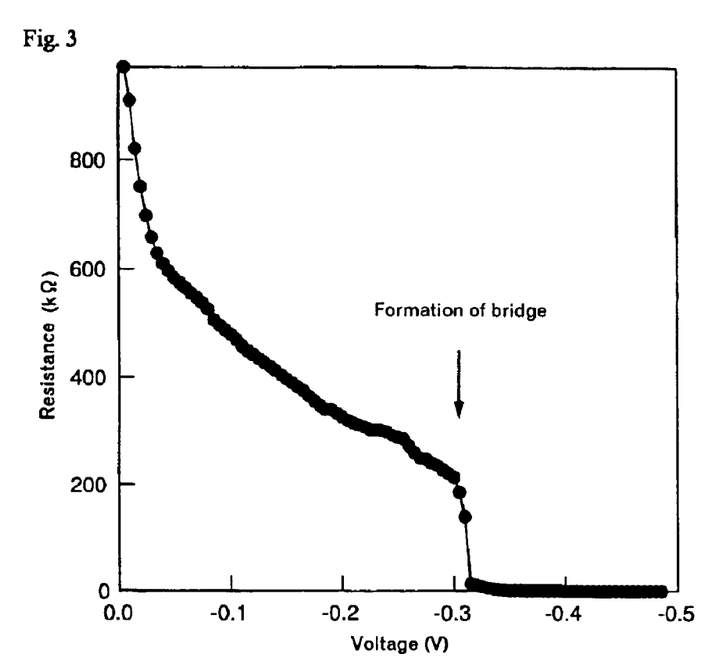
FIG. 3 is a diagram showing the construction of a bridge between electrodes using $Ag_2S$ as a mixed electroconducting material.

Using an electronic element manufactured in this way, a voltage was applied between the $Ag_2S$ electrode and the platinum electrode, and the voltage was swept at 50 mV/sec. The formation of a bridge between the electrodes is shown in FIG. 3. The voltage in the diagram shows the potential of the electroconducting electrode relative to the $Ag_2S$ electrode, based on the $Ag_2S$ electrode. When the applied volage is in the vicinity of V=0~−0.3V, the inter-electrode resistance has a comparatively large value, and the resistance falls gradually as the voltage increases. This is due to the fact that movable silver ions (atoms) in the $Ag_2S$ electrode deposit on the surface of the $Ag_2S$ electrode with the increase in voltage, and the distance between the electrodes becomes narrow. When the voltage reaches the vicinity of V=−0.3V, the resistance decreases rapidly. This is because the projection formed due to deposition of the movable silver ions (atoms) comes in contact with the facing platinum electrode, and forms a bridge. When V=−0.3V∼−0.49V after the resistance has fallen sharply, the resistance decreases slowly. This is due to further migration of movable silver ions (atoms) in the $Ag_2S$ electrode so that the bridge gradually becomes thicker.

EXAMPLE 2

Figure 4:
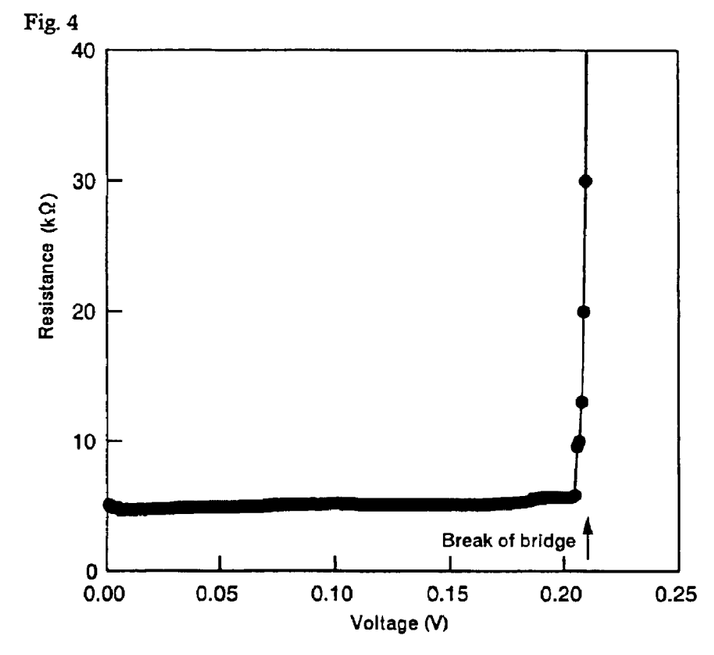
FIG. 4 is a diagram showing the disconnection of the bridge formed between the electrodes.

FIG. 4 shows the case where, using an identical electronic element to that of Example 1, a bridge is disconnected. Herein, the polarity of the voltage applied was reversed from that used when the bridge was constructed. The resistance of the bridge increases slowly up to the vicinity of V=0∼0.20V. This is because the silver atoms forming the bridge gradually move and return to the $Ag_2S$ electrode, so the bridge gradually becomes thinner. A rapid increase in resistance is observed in the vicinity of V=0.20V. This rapid increase of resistance is due to the disconnection of the bridge, so electrons do not pass through the bridge and flow only due to the tunnel effect.

In other words, by changing the polarity of the voltage, the silver projection can be lengthened and a bridge can be formed, or conversely, a bridge which has already been formed can be thinned and disconnected. When the bridge is formed, due to the effect of the voltage applied between the electrodes, movable silver ions in the $Ag_2S$ mixed electroconductor electrode migrate onto its surface, become silver metal atoms which deposit thereon, and form a projection. If this projection grows for a long time, a bridge is formed by joining with the facing platinum electrode. To disconnect the bridge, the polarity of the applied voltage is reversed so that the silver atoms forming the bridge migrate and return to the $Ag_2S$ mixed electroconductor electrode, so that the bridge becomes thinner.

EXAMPLE 3

Figure 5:
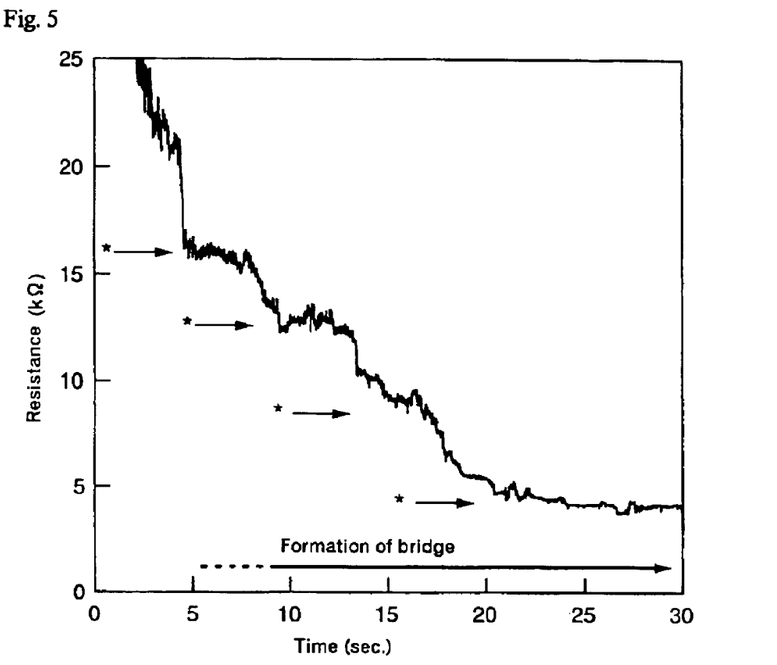
FIG. 5 is a diagram showing the construction of the bridge producing a quantized conductance.

Next, FIG. 5 shows the construction of a bridge comprising a fine wire or point contact producing a quantized conductance, using the electronic element of Example 1. In Example 1, the bridge is formed rapidly, so a fine wire or point contact producing a quantized conductance cannot be stably constructed. Hence, in this example, the voltage applied is reduced as far as possible to form a bridge while the silver projection is grown very slowly.

When a relatively small voltage of V=−2.5 mV was applied between the electrodes, a bridge was formed between the electrodes after several minutes-several tens of minutes. FIG. 5 shows the construction of this bridge. As the origin of time on the horizontal axis in FIG. 5, any arbitrary time immediately prior to formation of the bridge was taken as 0. The bridge is formed when the time is in the vicinity of 5 seconds, and the inter-electrode resistance slowly decreases with the elapsed time. At this time, as shown by the arrow marked * in FIG. 5, the resistance value decreases in stepwise fashion. This shows that, when the bridge is formed, a fine wire or point contact producing a quantized conductance is formed inside the bridge.

As shown in Example 1, when the voltage is swept at 50 mV/second, the bridge is formed at V=−0.3V or less, but the bridge can be formed even if a weak voltage in the vicinity of several mV is applied between the electrodes provided that there is sufficient time.

EXAMPLE 4

Figure 6:
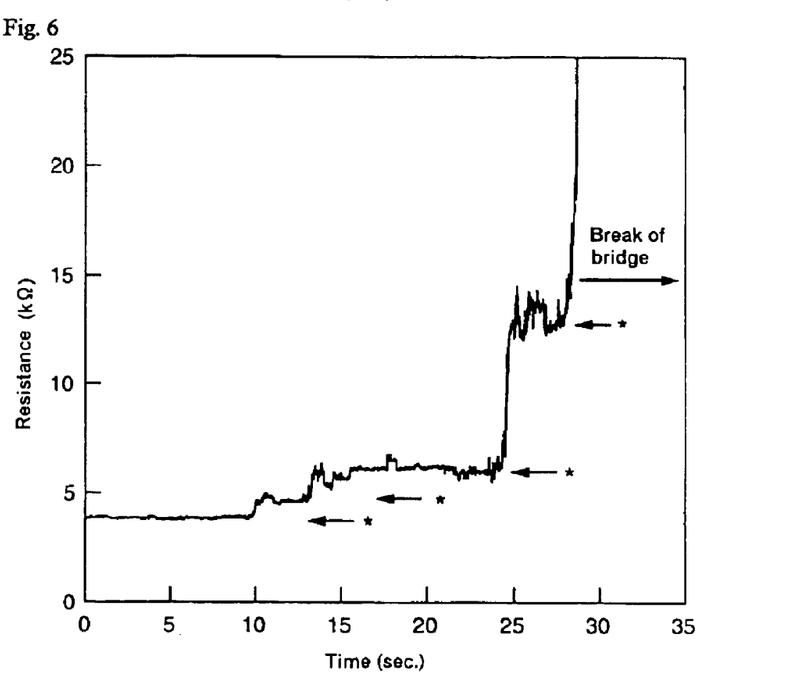
FIG. 6 is a diagram showing the disconnection of the bridge producing a quantized conductance.

In this example, using the electronic element with bridge of Example 3, instead of applying the voltage V=−25 mV, a relatively small voltage V=+5 mV of reverse polarity was applied between the electrodes where the bridge was formed, and after several minutes-several tens of minutes, the bridge had disconnected. FIG. 6 shows this event. As the origin of time on the horizontal axis in FIG. 6, any arbitrary time immediately prior to applying the voltage was taken as 0. Conversely to Example 3, the inter-electrode resistance gradually increases with the elapsed time. This increase of resistance is due to the fact that the bridge gradually becomes thinner with time. As shown by the arrow marked * in FIG. 6, the resistance increases in a stepwise fashion just before the bridge disconnects, which shows that the bridge comprises a fine wire or point contact producing a quantized conductance.

EXAMPLE 5

Figure 7:
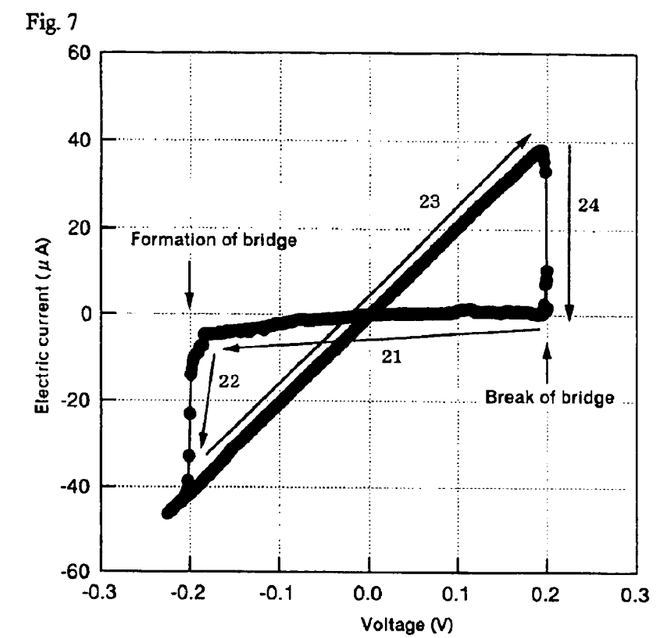
FIG. 7 is a diagram showing control of voltage and current variation accompanying the construction and disconnection of the bridge.

In this example, the inter-electrode conductance is controlled by constructing and disconnecting the bridge between the electrodes. FIG. 7 shows the control of voltage and current characteristics accompanying the construction and disconnection of the bridge, using an electronic element prepared in an identical way to that of Example 1.

When the voltage was varied in the manner: 0.20V→0V→0.23V→0V→0.2V, the current flowing varied in the manner 21→22→23→24, as shown by the numbers of the arrows in the figure.

In a region 21 where the bridge has not yet formed, a slight current flows due to the tunnel effect. In a region 22, the bridge forms, and when the thickness of the bridge varies, a very large electric current flows. In a region 23, an electric current flows through the bridge of silver atoms. In a region 24, the bridge becomes narrower and disconnects, so the current amount sharply decreases. Finally, there is a return to the region where the tunnel current shown in the region 21 flows.

Thus, by varying the magnitude and polarity of the applied voltage in this way, the bridge between the electrodes can be formed or disconnected, i.e., the inter-electrode conductance accompanying these processes can be controlled.

The fact that the conductance can be controlled by forming and disconnecting the bridge shown here, can be used in an electronic element having a switching function or a function where current flows more easily to one of the electrodes.

EXAMPLE 6

Figure 8:
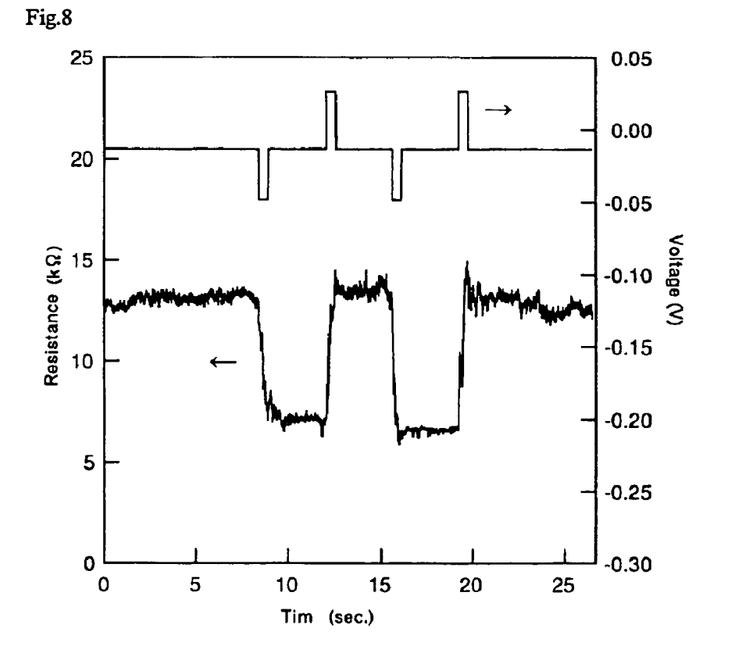
FIG. 8 is a diagram showing an example of how conductance control is used.

FIG. 8 shows an example where the conductance of the bridge is controlled using an electronic element prepared in an identical way to that of Example 1.

By controlling the voltage applied between the electrodes, the control of the conductance by the formed bridge becomes possible, then the control of the conductance can be utilized. When the bridge shown in Examples 1–4 is formed, by considerably decreasing or eliminating the voltage applied to form or disconnect the bridge between the electrodes, the further growth or thinning of the bridge can be stopped. In this state, the bridge can be grown to any desired thickness or thinned by temporarily applying a suitable voltage between the electrodes. This is because silver ions (atoms) which are movable ions, migrate between the bridge and the $Ag_2S$ electrode due to the effect of the voltage and current. In other words, the inter-electric conductance can be controlled by controlling the thickness of this bridge.

According to this example, firstly, after the bridge, fine wire or point contact producing a quantized conductance is formed between the electrodes, the applied voltage is decreased to V=−15 mV so as to stop the growth of the bridge. At this time, the inter-electrode resistance is arranged to be approximately 13 kΩ, which corresponds to the inverse of the unit value $2e^2/h$ of the quantized conductance (e is the elementary charge, h is Planck's constant). Next, by applying a voltage (V=−50 mV) in a pulse fashion to grow the bridge more thickly, the resistance of the bridge becomes approximately ½, i.e., 6.5 kΩ. In other words, the quantized conductance can be made double the unit value. Subsequently, by applying a voltage (V=25 mV) of reverse polarity in a pulse fashion to make the bridge thinner, the resistance can be returned to approximately 13 kΩ which is the unit value of the original quantized conductance.

In other words, by controlling the applied voltage, the quantized bridge conductance can easily be controlled to any desired value. This technique may be used not only for thin bridges producing a quantized, discrete conductance, but also for controlling the general conductance of relatively thick bridges where no quantum effect is produced.

Further, various electronic elements can be manufactured using this conductance control. For example, the bridge formed between the electrodes can be changed to a bridge having a desired conductance by applying a voltage controlled in pulse fashion or the like. Subsequently, this conductance value is read out by applying a small voltage and current for which the conductance of the bridge does not vary. This function may be used for data storage elements, switching elements or the like. Further, an electronic element (cranial nerve element) which learns (by applying a pulse voltage) and in which electrical signals flow easily, can be manufactured using the fact that the conductance obtained varies with the magnitude of the applied voltage, number of pulses and time.

EXAMPLES 7, 8

Figure 9:
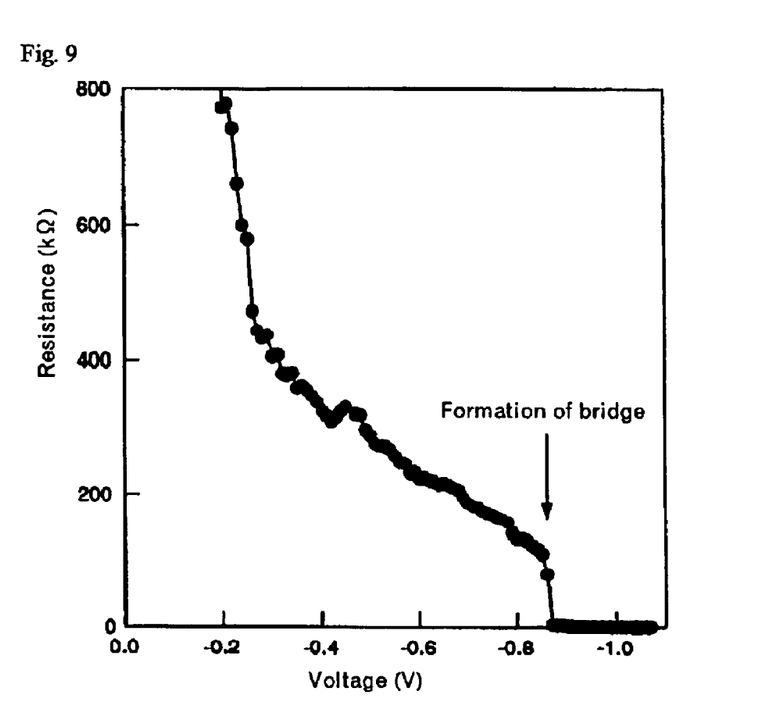
FIG. 9 is a diagram showing the construction of a bridge between electrodes using $Ag_2Se$ as a mixed electroconducting material.

In Example 7, an identical experiment was performed using $Ag_2Se$ instead of $Ag_2S$ as the mixed electroconducting material electrode of Example 1. The formation of a bridge due to silver atoms between the electrodes is shown in FIG. 9.

Figure 10:
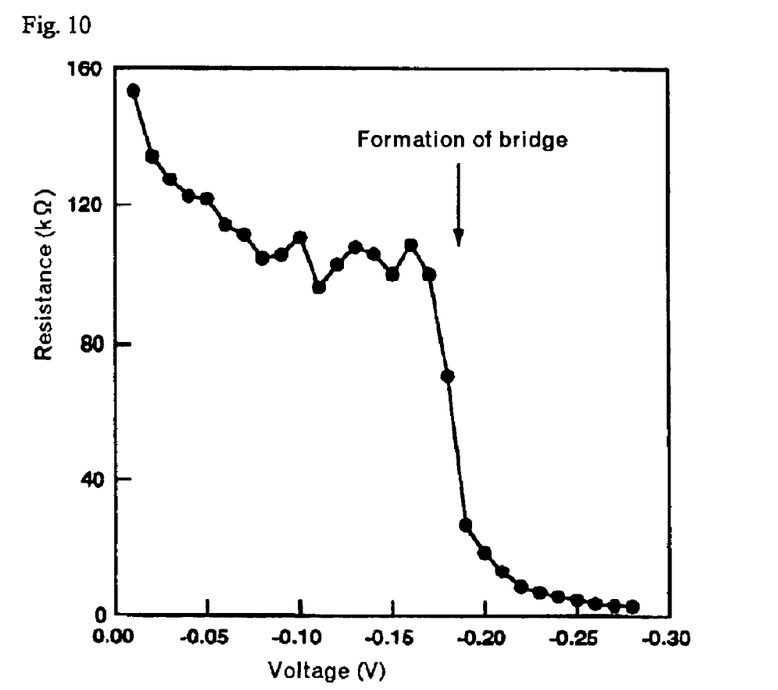
FIG. 10 is a diagram showing the construction of a bridge between electrodes using $Cu_2S$ as a mixed electroconducting material.

In Example 8, an identical experiment was performed using $Cu_2S$ instead of $Ag_2S$ as the mixed electroconducting material electrode of Example 1. A bridge was formed due to copper atoms between the electrodes. This is shown in FIG. 10.

A bridge was formed between the electrodes even when these mixed electroconducting material electrodes were used, and although not shown, disconnection of the bridge and quantization of the conductance were observed as in the aforesaid examples. In these examples, as the mixed electroconducting material or inter-electrode distance was different to those of Examples 1–6, the inter-electrode resistance and voltage at which the bridge was formed, are different.

According to this invention, in addition to the above uses, the following electronic elements can be manufactured.

The formation of a bridge can be used as a multilayer memory which uses quantized inter-electrode conductance to give stepwise values. For example, if the channel transmission probability (Ti) is 1, the quantized conductance (G) is given by:

$$G = n \times 2e^2/h (n=1, 2, 3 \ldots)$$

(wherein, e is the elementary charge, h is Planck's constant). Here, n may take any desired value by applying a suitable voltage, as shown for example in FIG. 8 of Example 6. Consequently, in memory devices using this bridge, plural states n=1, 2, 3 . . . may be recorded on one bit, and the recording density can be largely increased.

This invention may also be used as a low power consumption device. In existing memory devices, a working voltage of 1V or higher and a current of the order of milliamperes is required for one device (i.e., for writing or reading 1 bit). If this invention is used, as shown by the aforesaid examples, a device can be manufactured with a working voltage of 1V or less, and a power consumption of the order of less than microamperes. In other words, a memory device having a power consumption of less than $10^{-6}$ W per bit is possible.

Further, as shown in Examples 1–4 (FIGS. 3–6), the inter-electrode conductance varies from about several times to $10^6$ times depending on the formation or disconnection of the inter-electrode bridge. By reading this conductance variation, by applying a small voltage at which a conductance variation does not occur, it is easily possible to read whether the device which is open or closed. By installing plural devices having this switching function, an AND or OR logical gate for computers or an electronic circuit having a memory function, can be manufactured.

What is claimed is:

1. An electronic element comprising a first electrode comprising a mixed electroconducting material having ion conductance and electron conductance, and a second electrode comprising an electroconducting substance, in which the conductance between the electrodes can be controlled.

2. The electronic element according to claim 1, wherein the distance between said electrodes is 100 nanometers or less.

3. The electronic element according to claim 2, wherein said mixed electroconducting material is $Ag_2S$, $Ag_2Se$, $Cu_2S$ or $Cu_2Se$.

4. The electronic element according to claim 2, wherein the power consumption is $10^{-5}$ W or less.

5. The electronic element according to claim 2, which operates at a voltage of 0.5V or less, and a current of 50 microamperes or less.

6. The electronic element according to claim 2, wherein a bridge is formed between said electrodes, by applying a voltage between said electrodes so that the second electrode is negative with respect to the first electrode so that movable ions migrate from the first electrode to the second electrode.

7. The electronic element according to claim 2, wherein the conductance between said electrodes is quantized.

8. The electronic element according to claim 7, wherein the conductance (G) is given by:

$$G = \frac{2e^2}{h} \sum_{i=1}^{N} Ti$$

(where, e is the elementary charge, h is Planck's constant and Ti is the transmission probability of the ith channel contributing to conduction).

9. A method of controlling inter-electrode conductance comprising at least one of the steps of;
   a. applying a voltage between the electrodes of an electronic element having a first electrode comprising a mixed electroconducting material having ion conductance and electron conductance, and a second electrode comprising an electroconducting substance, in which the conductance between the electrodes can be controlled, said voltage being applied so that the second electrode is negative with respect to the first electrode so that a bridge is formed between the electrodes due to the migration of movable ions from the first electrode to the second electrode, and
   b. reversing the inter-electrode polarity so that the bridge is thinned or disconnected.

10. The method according to claim 9, wherein the conductance between said electrodes is quantized.

11. The method according to claim 10, wherein the conductance is given by:

$$G = \frac{2e^2}{h} \sum_{i=1}^{N} Ti$$

(where, e is the elementary charge, h is Planck's constant and Ti is the transmission probability of the ith channel contributing to conduction).

12. The method according to claim 9, wherein the conductance is controlled by applying a pulse voltage between the electrodes.

13. The method according to claim 11, wherein the conductance is controlled by applying a pulse voltage between the electrodes.

14. The electronic element according to claim 3, wherein the power consumption is $10^{-5}$ W or less.

15. The electronic element according to claim 3, which operates at a voltage of 0.5V or less, and a current of 50 microamperes or less.

16. The electronic element according to claim 3, wherein a bridge is formed between said electrodes, by applying a voltage between said electrodes so that the second electrode is negative with respect to the first electrode so that movable ions migrate from the first electrode to the second electrode.

17. The electronic element according to claim 3, wherein the conductance between said electrodes is quantized.

18. The electronic element according to claim 14, which operates at a voltage of 0.5V or less, and a current of 50 microamperes or less.

19. The electronic element according to claim 18, wherein a bridge is formed between said electrodes, by applying a voltage between said electrodes so that the second electrode is negative with respect to the first electrode so that movable ions migrate from the first electrode to the second electrode.

20. The electronic element according to claim 19, wherein the conductance between said electrodes is quantized.

* * * * *